(12) United States Patent
Oshima et al.

(10) Patent No.: US 11,255,888 B2
(45) Date of Patent: Feb. 22, 2022

(54) LOAD ESTIMATING DEVICE AND POWER SUPPLY DEVICE

(71) Applicant: HONDA MOTOR CO., LTD., Tokyo (JP)

(72) Inventors: Mio Oshima, Wako (JP); Hiroyuki Eguchi, Wako (JP)

(73) Assignee: HONDA MOTOR CO., LTD., Tokyo (JP)

(*) Notice: Subject to any disclaimer, the term of this patent is extended or adjusted under 35 U.S.C. 154(b) by 23 days.

(21) Appl. No.: 17/023,643

(22) Filed: Sep. 17, 2020

(65) Prior Publication Data
US 2021/0003620 A1 Jan. 7, 2021

Related U.S. Application Data

(63) Continuation of application No. PCT/JP2018/011064, filed on Mar. 20, 2018.

(51) Int. Cl.
*G01R 21/06* (2006.01)
*G01R 31/382* (2019.01)
*G01F 23/00* (2022.01)

(52) U.S. Cl.
CPC ............. *G01R 21/06* (2013.01); *G01F 23/00* (2013.01); *G01R 31/382* (2019.01)

(58) Field of Classification Search
CPC .... G01R 21/06; G01R 31/382; G01R 21/133; G01F 23/00; G01D 2204/24
USPC ......................................................... 324/427
See application file for complete search history.

(56) References Cited

U.S. PATENT DOCUMENTS

| | | | | |
|---|---|---|---|---|
| 2011/0251807 A1* | 10/2011 | Rada | ........................ | G01D 4/00 702/61 |
| 2014/0336831 A1* | 11/2014 | Seo | ........................ | G05B 15/02 700/286 |
| 2017/0234914 A1 | 8/2017 | Choi et al. | | |

FOREIGN PATENT DOCUMENTS

| | | |
|---|---|---|
| JP | 5-10973 A | 1/1993 |
| JP | 2000-292465 A | 10/2000 |
| JP | 2002-311070 A | 10/2002 |
| JP | 2007-3296 A | 1/2007 |
| JP | 2017-142227 A | 8/2017 |

OTHER PUBLICATIONS

International Search Report dated May 29, 2018, issued in counterpart International Application No. PCT/JP2018/011064 (2 pages).

* cited by examiner

*Primary Examiner* — Tung X Nguyen
*Assistant Examiner* — Robert P Alejnikov, Jr.
(74) *Attorney, Agent, or Firm* — Westerman, Hattori, Daniels & Adrian, LLP

(57) ABSTRACT

A load estimating device measures a voltage and a current supplied to a plurality of loads connected with a power supply, and obtains feature amounts of the plurality of loads from measurement values of the voltage and the current. A storage device stores a feature amount of each combination of two or more loads in advance. The load estimating device estimates what the plurality of loads connected with the power supply device are, on the basis of the obtained feature amounts and the feature amounts stored in the storage device. The feature amount includes a combination of an apparent power and a power factor.

9 Claims, 7 Drawing Sheets

FIG. 6

| IDENTIFYING INFORMATION OF LOAD | RATED POWER CONSUMPTION [W] | TYPICAL POWER AMOUNT [Wh] |
|---|---|---|
| LIGHTING DEVICE | 10 | NA |
| RICE COOKER | 400 | 200 |
| COMPRESSOR | 700 | 70 |
| ELECTRIC KETTLE | 800 | 40 |
| HEATER | 900 | NA |
| DRYER | 1000 | 50 |

LOAD ESTIMATING DEVICE AND POWER SUPPLY DEVICE

CROSS-REFERENCE TO RELATED APPLICATION(S)

This application is a continuation of International Patent Application No. PCT/JP2018/011064 filed on Mar. 20, 2018, the entire disclosures of which is incorporated herein by reference.

BACKGROUND OF THE INVENTION

Field of the Invention

The present invention relates to a load estimating device for estimating a load connected with a power supply device.

Description of the Related Art

A power generator is configured to be connected with various loads (electric devices). In the case of an engine-driven type power generator; the engine-driven type power generator cannot generate power if fuel runs out. For example, if the fuel runs out before a rice cooker completes cooking of rice, it would result in not only failure of cooking the rice but also wasting the rice. Thus, it is considered that, if it is possible to estimate a type or name of the load connected to the power generator, it would become possible to determine whether or not the power generator still has enough fuel to supply enough power to the load.

Patent Literature 1 describes a configuration for determining an operation state of an electric device by causing a neural network to learn about a fundamental wave and a high harmonic wave of a current and the operation state of the electric device. Paten Literature 2 describes a configuration for determining whether or not a load is in an operation state, by frequency analysis of a fundamental wave and a high harmonic Wave of a current.

CITATION LIST

Patent Literature

PTL1: Japanese Patent Laid-Open No. 2000-292465
PTL2: Japanese Patent Laid-Open No. 2007-003296

According to Patent Literature 1, it is necessary to have a vast number of pieces of training data for the leaning of the neural network. In the first place, Patent Literature 1 is not a technique for determining the type of load. Patent Literature 2 requires the frequency analysis, thereby requiring a huge amount of calculation. Moreover, Patent Literature 2 is also not a technique for determining the type of load. Furthermore, Patent Literatures 1 and 2 cannot estimate a plurality of loads at once.

SUMMARY OF THE INVENTION

The present invention provides, for example, a load estimating device including: a measuring circuit configured to measure a voltage and a current supplied to a plurality of loads connected with a power supply device; a calculating unit configured to calculate feature amounts of the plurality of loads from measurement values of the voltage and the current measured by the measuring circuit; a storage device configured to store a feature amount of each combination of two or more loads in advance; and a load estimating suit configured to estimate what the plurality of loads connected with the power supply device are, on the basis of the feature amounts calculated by the calculating unit and the feature amounts stored in the storage device, wherein the feature amount includes a combination of an apparent power and a power factor.

Further features of the present invention will become apparent from the following description of exemplary embodiments (with reference to the attached drawings).

BRIEF DESCRIPTION OF THE DRAWINGS

FIG. 6 is a view for explaining power data.

DESCRIPTION OF THE EMBODIMENTS

[Power Supply Device]

A power supply device is a device capable of supplying power to one or more loads (electric devices). The power supply device may be, for example, an engine-driven power generator, a storage battery, an engine-driven power generator provided with a storage battery, or the like. Therefore, the power supply device may be, for example, a transportable engine-driving power generator. For example, the power supply device, may be usable outdoor such as at a campsite. Such a power supply device is not supplied with power from a commercial AC power source, and is independent from such a commercial AC power source. For example, the engine-driven power generator can supply power to a load as long as the engine-driven power generation still has fuel. In case of a storage battery, the storage battery can supply power to a load as long as a charge still remains in the storage battery. Moreover, in case of an engine-driven power generator provided with a storage battery, the engine-driven power generator provided with the storage battery can supply power to a load as long as fuel and a charge remain in the engine-driven power generator provided with the storage battery. Note that different loads have different rated power consumptions and different power consumptions. For example, a rice cooker consumes a large amount of power in a cooking initial period, and consumes a small amount of power in a steaming period. A typical power amount necessary for a rice cooker from a start to an end of rice cooking has been known. A power amount necessary for an electric kettle to boil a prescribed amount of water has been known (where a boiling point depending on altitude may be additionally taken into consideration). Therefore, if it becomes possible to estimate a load, it becomes possible to determine, based on a remaining amount of fuel or the like, whether or not an electric device can accomplish a main object (for example, typical operations such as rice cooking and water boiling). For some devices such as lighting devices, heaters, and air compressors, when to use the device rimy be largely different depending on users. In such a case, a continuous operable time of the electric device can be calculated out on the basis of the rated power consumption of the electric device and the remaining amount of the fuel. The user may give priority to operation of a certain load among loads by stopping a load other than the certain load, referring to the continuous operable time.

Figure 1:
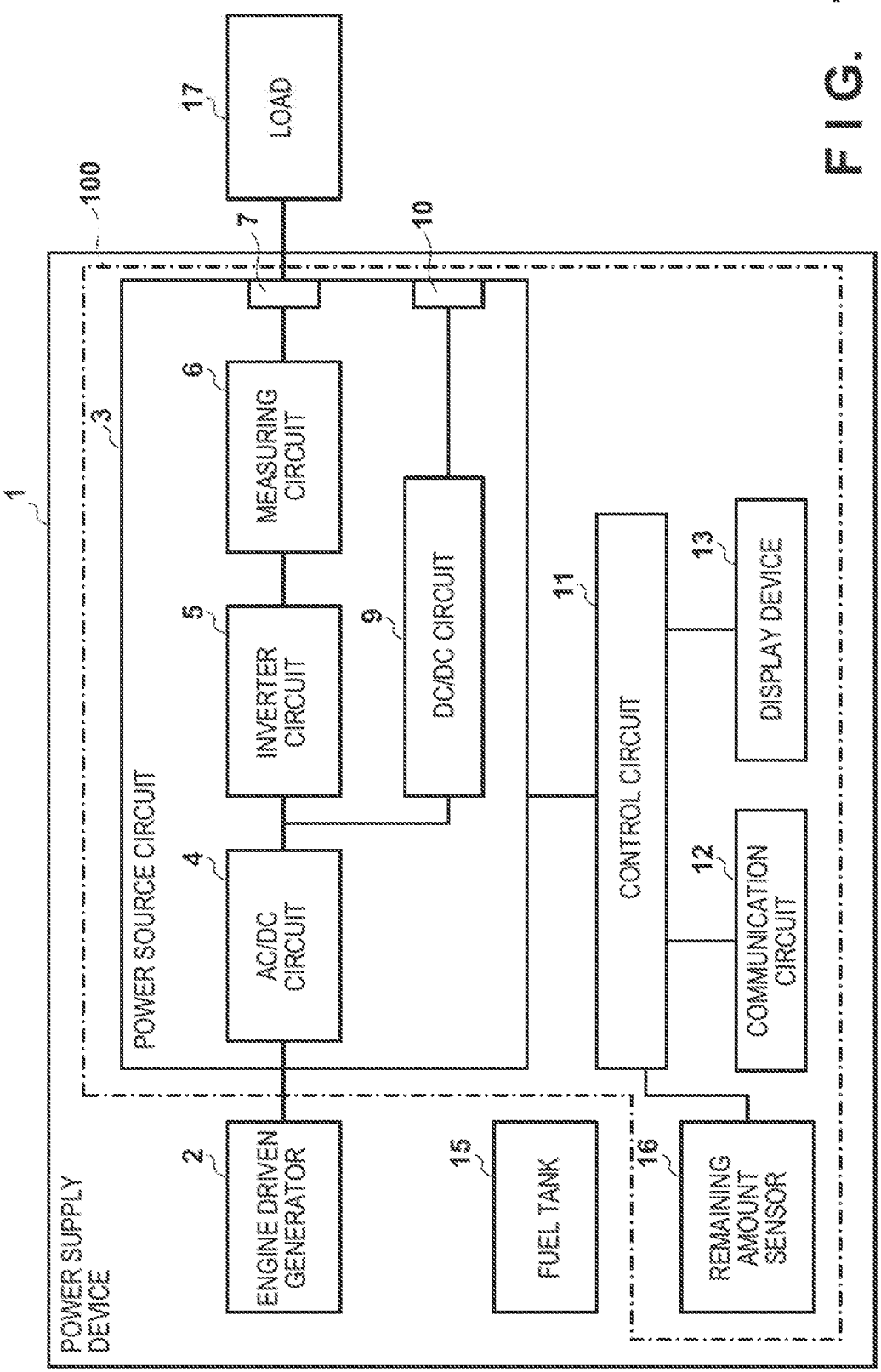
FIG. 1 is a view for explaining a configuration example of a power supply device.

FIG. 1 is a block diagram illustrating a power supply device 1. An engine power generator 2 is a power generator configured to generate power by being driven by an engine configured to operate, replying on fuel supplied from a fuel tank 15. The fuel may be, for example, gasoline, liquified petroleum gas, hydrogen, or the like. A power source circuit 3 is a circuit configured to convert a voltage thus generated by the engine power generator 2 into a predetermined alternating current or direct current. An AC/DC circuit 4 includes circuits such as a rectifying and smoothing circuit configured to rectify and smooth the alternating current thus generated by the engine power generator 2. An inverter circuit 5 is a circuit configured to convert a direct current outputted from the AC/DC circuit 4 into an alternating current having a predetermined stable frequency. A measuring circuit 6 is configured to measure an alternating voltage and an alternating current supplied to a load 17 connected to an AC outlet 7, and to output measurement results to a control circuit 11. The AC outlet 7 may be provided with a plurality of receptacles thereby to be connectable with a plurality of loads 17. Moreover, the AC outlet 7 may be connected with a power source tap, to which a plurality of loads 17 are connectable. A DC/DC circuit 9 is configured to convert a level of the DC voltage outputted from the AC/DC circuit 4, and supplies an operation voltage of the level to a control circuit 11 or the like, or outputs the DC of the level from a DC outlet 10. The control circuit 11 is a circuit configured to control the power source circuit 3, a communication circuit 12, a display device 13, and the like. The communication circuit 12 is a circuit configured to communicate with a smartphone or a PC (personal computer) via wired communication or wireless communication. The display device 13 is configured to output, for example, intimation indicating type of load and the continuous operable time to a user. A remaining amount sensor 16 is configured to gauge a remaining amount of the fuel contained in the fuel tank 15, and to output a measurement result to the control circuit 11. The control circuit 11 is configured to calculate each feature amount of a plurality of loads on the basis of the measurement results of the measuring circuit 6, and to estimate what the loads are (type, name, or the like) on the basis of the feature amounts. The control circuit 11 determines a continuous operable time of the loads on the basis of the remaining amount of fuel and the power consumptions of the load.

Figure 2:
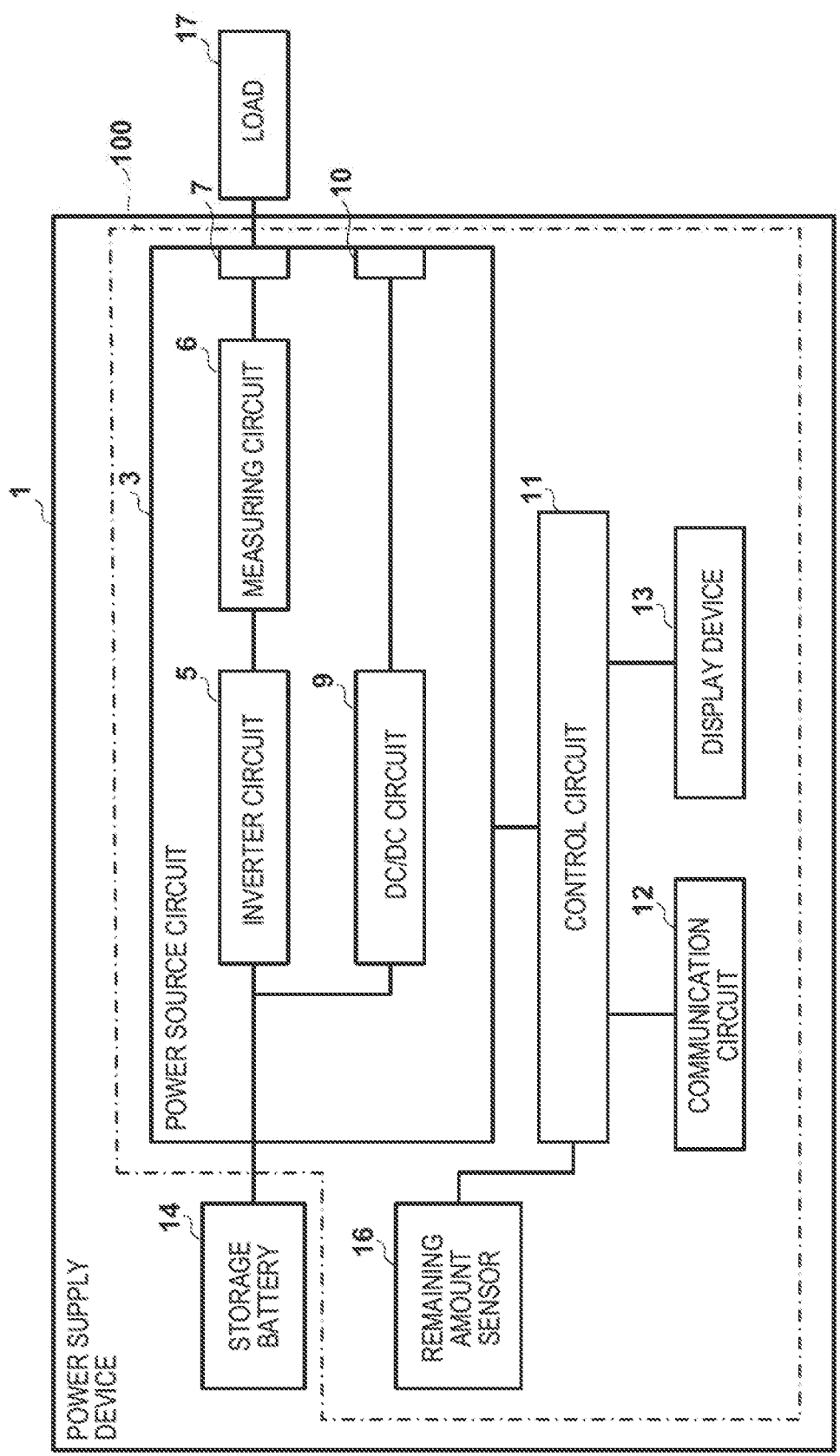
FIG. 2 is a view for explaining a configuration example of a power supply device.

FIG. 2 illustrates a power supply device 1 including a storage battery 14 instead of the engine power generator 2. Explanation of parts in FIG. 2 which are common with these in FIG. 1 will be omitted here. The storage battery 14 may be, for example, configured to output a DC voltage of, for example, 48 V to the inverter circuit 5 or the DC/DC circuit 9. The remaining amount sensor 16 is configured to gauge a charge level (Ah) of the storage battery 14 by monitoring a voltage [V] of the storage battery 14. In general, the charge level of the storage battery 14 and the voltage thereof are correlated. The remaining amount sensor 16 converts the voltage of the storage battery 14 into the charge level thereof according to the correlation. The control circuit 11 determines, on the remaining charge level of the storage battery and the power consumptions of the loads, a time in which the loads can be continuously operated (hereinafter, which is referred to as the continuous operable time).

Figure 3:
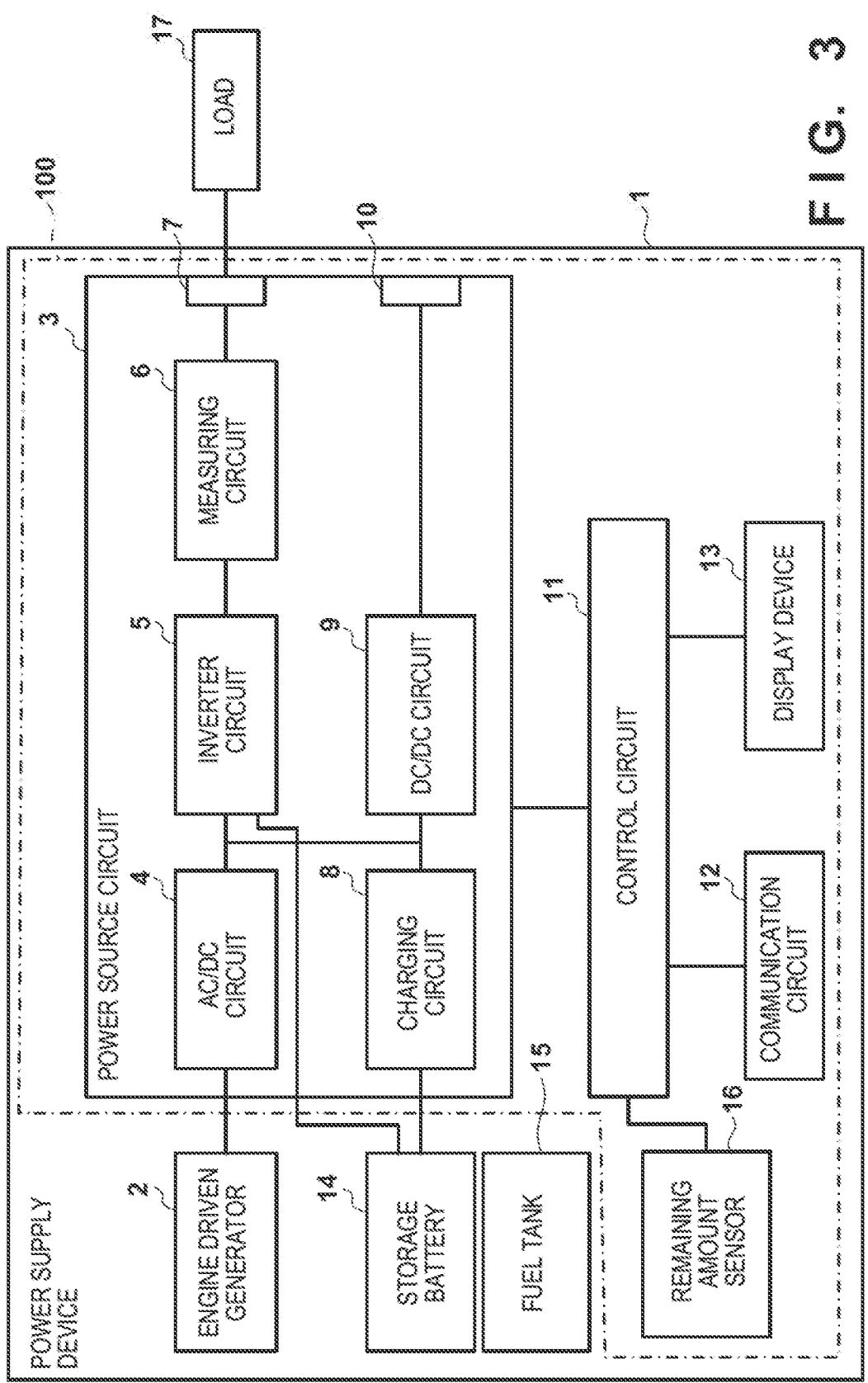
FIG. 3 is a view for explaining a configuration example of a power supply device.

FIG. 3 illustrates a power supply device 1 provided with an engine power generator 2 and a storage batter 14. Explanation on parts of FIG. 3 which are common with these in FIGS. 1 and 2 will be omitted here. A remaining amount sensor 16 is configured to gauge the remaining amount of the fuel contained in the fuel tank 15 and to gauge a charge level of the storage battery 14. The inverter circuit 5 is configured to convert, into an alternating current, a direct current generated by the AC/DC circuit 4 or a direct current supplied from the storage battery 14. A charging circuit 8 is configured to charge the storage battery 14 with the power generated by the engine power generator 2. The power supply device 1 illustrated in FIG. 3 is capable of supplying the power stored in the storage battery 14 to the load 17, even after the fuel runs out. The control circuit 11 is configured to determine the continuous operable time of the loads on the basis of the remaining amount of the fuel, the charge level, and the power consumptions of the loads.

According to FIGS. 1, 2, and 3, the power source circuit 3, the control circuit 11, the remaining amount sensor 16, the communication circuit 12, and the display device 13 constitute a load estimating device 100.

[Control Circuit]

Figure 4:
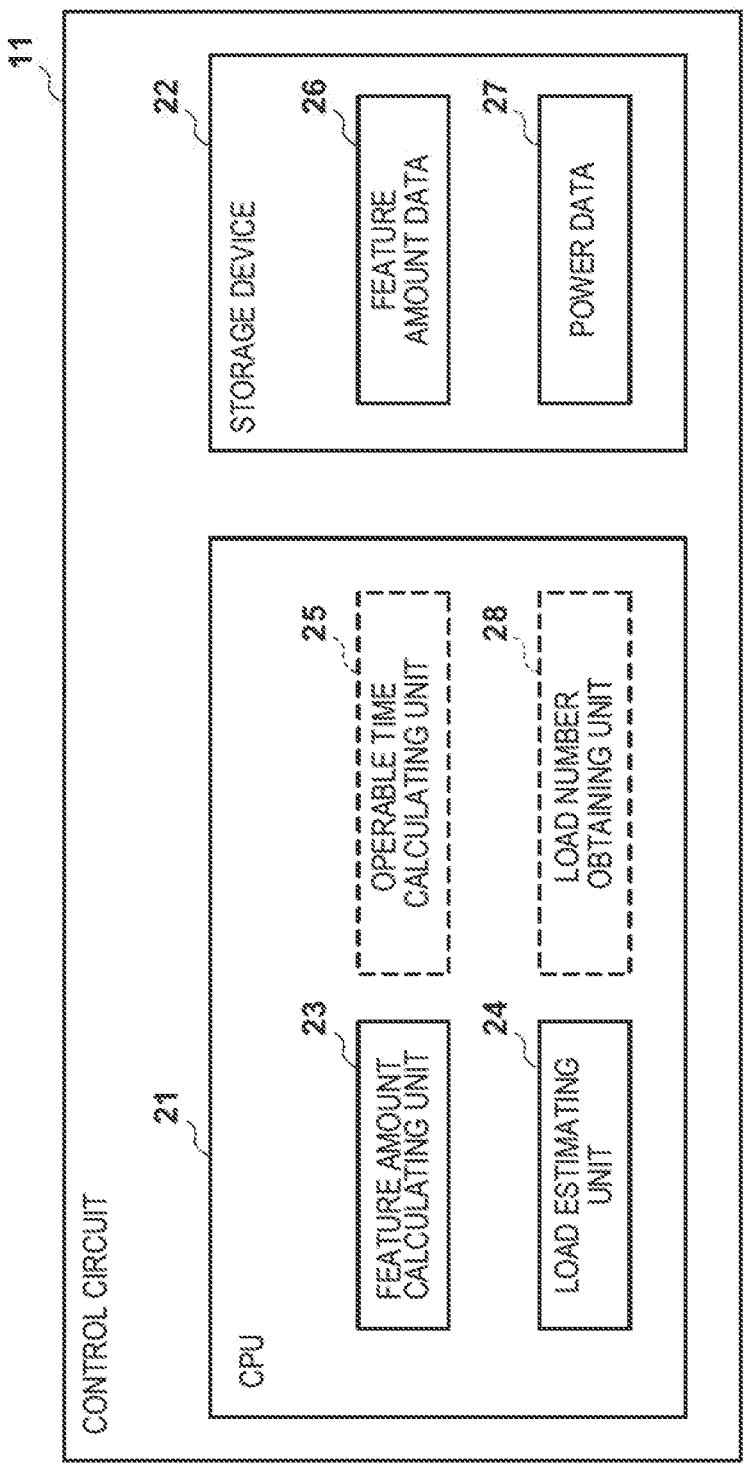
FIG. 4 is a block diagram for explaining a control circuit of the power supply device.

FIG. 4 illustrates the control circuit 11. In FIG. 4, the parts indicated with broken lines are optional. A CPU 21 is a processor circuit (central processing unit) configured to control the power supply device 1 according to a control program stored in a storage device 22. The storage device 22 is a storage circuit including a non-volatile memory (ROM: Read Only Memory), a volatile memory (RAM: Random Access Memory), or the like.

The CPU 21 has a plurality of functions, which can be realized by executing the control program. Note that, part or all of the functions may be realized by hardware circuits such as DSP (Digital Signal Processor) or FPGA (Field Programmable Gate Array). A feature amount calculating unit 23 is configured to calculate out the feature amounts of the plurality of loads from the measurement value of the voltage and the measurement value of the current thus measured by the measuring circuit 6. The feature amounts may be, for example, an apparent power and a power factor. The power factor may be obtained by dividing an effective power with the apparent power or may be calculated out as $\cos \theta$ of a phase difference between the voltage and the current. In the latter case, the measuring circuit 6 measures the phase difference $\theta$. Further, the feature amount may include a stabilization time, which is a time period necessary from activation of the load to stable operation of the load, or a peak value of an activation current, which flows across the load at the activation of the load. The storage device 22 stores therein feature amount data 26 and power data 27. The feature amount data 26 is data in which types or names (or feature amount identifying information) of loads are associated with feature amounts of the loads. Especially, the present invention is configured such that the feature amount data 26 includes feature amounts of combinations of two or more loads. A load estimating unit 24 is configured to estimate what the plurality of loads connected with the power supply device 1 are, on the basis of the feature amounts calculated by the feature amount calculating unit 23 and known feature amounts stored in the storage device 22. An operable time calculating unit 25 determines, based on the power consumptions of the plurality of loads thus estimated by the load estimating unit 24 and the remaining amount of the fuel and/or the charge level, how long the plurality of loads can be continuously operated (continuous operable time). The CPU 21 may be configured to cause the display device 13 to display the continuous operable time thereon, or transmit the continuous operable time to an external information processing device (communication terminal) via the communication circuit 12 so as to cause a display of the external information processing device to display the continuous operable time thereon. The power data 27 may include rated power consumptions of the loads and power amounts necessary for attaining main objects of the loads. A load number obtaining unit 28 is configured to obtain information as to how many loads are connected to the AC outlet 7. The information as to the number of loads may be inputted via the information processing device by a user, or the number of loads may be identified on the basis of changes of currents outputted from the AC outlet 7 over time.

[Feature Amount Map]

Figure 5:
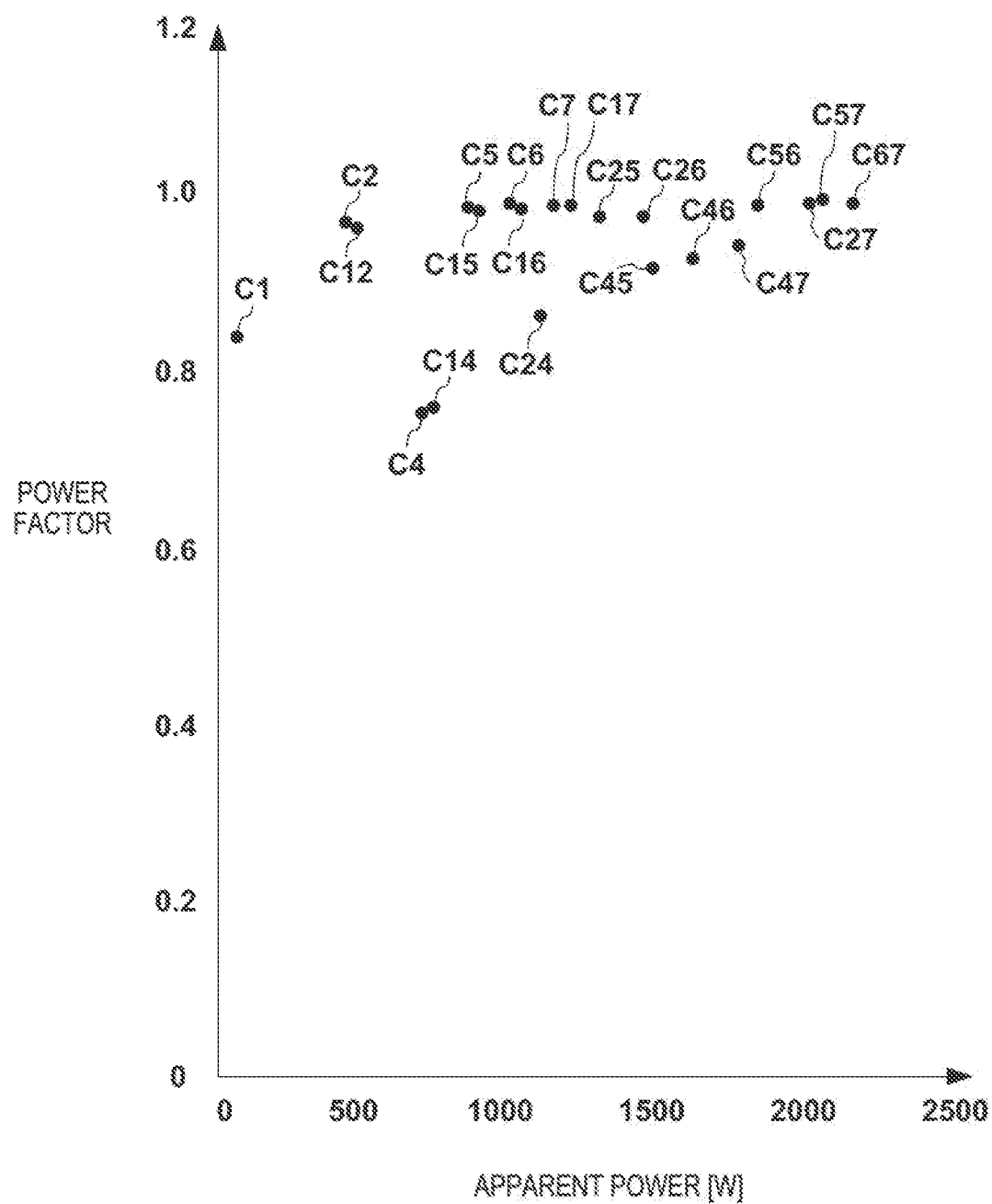
FIG. 5 is a view for explaining a feature amount map that may be included in feature amount data.

FIG. 5 illustrates a feature amount map constituting part of the feature amount data 26. Here, the apparent power and the power factor are exemplified as the feature amounts. FIG. 5 illustrates, by dots, coordinates of feature amounts solely of the loads and coordinates of feature amounts of combinations of two or more loads. As a matter of course, dots for coordinates of feature amounts of combinations of three or more loads are omitted for the sake of the simplicity of the illustration of the feature amount map.

A feature amount $C1$ indicates a feature amount solely of a lighting device.

A feature amount $C2$ indicates a feature amount solely of a rice cooker.

A feature amount $C4$ indicates a feature amount solely of a compressor.

A feature amount $C5$ indicates a feature amount solely of an electric kettle.

A feature amount $C6$ indicates a feature amount solely of a heater.

A feature amount $C7$ indicates a feature amount solely of a drier.

A feature amount $C12$ indicates a feature amount of a combination of the lighting device and the rice cooker.

A feature amount $C14$ indicates a feature amount of a combination of the lighting device and the compressor.

A feature amount $C15$ indicates a feature amount of a combination of the lighting device and the electric kettle.

A feature amount $C16$ indicates a feature amount of a combination of the lighting device and the heater.

A feature amount $C17$ indicates a feature amount of a combination of the lighting device and the drier.

A feature amount $C24$ indicates a feature amount of a combination of the rice cooker and the compressor.

A feature amount $C25$ indicates a feature amount of a combination of the rice cooker and the electric kettle.

A feature amount $C26$ indicates a feature amount of a combination of the rice cooker and the heater.

A feature amount $C27$ indicates a feature amount of a combination of the rice cooker and the drier.

A feature amount $C45$ indicates a feature amount of a combination of the compressor and the electric kettle.

A feature amount $C46$ indicates a feature amount of a combination of the compressor and the heater.

A feature amount $C47$ indicates a feature amount of a combination of the compressor and the drier.

A feature amount $C56$ indicates a feature amount of combination of the electric kettle and the heater.

A feature amount $C57$ indicates a feature amount of a combination of the electric kettle and the drier.

A feature amount $C67$ indicates a feature mount of a combination of the heater and the drier.

The load estimating unit 24 is configured w calculate out a distance between coordinates of the feature amount calculated out by the feature amount calculating unit 23 and coordinates of the feature amounts stored in the storage device 22, and to determine the coordinates of that one of the feature amounts stored in the storage device 22 with which a minimum distance dmin can be obtained. The load estimating unit 24 is configured to obtain the type or name (distinguishing information) of the load associated with the feature amount thus determined. For example, if the load estimating unit 24 determines that the feature amount with which the minimum distance can be obtained is $C56$, the load estimating unit 24 extracts, from the feature amount data 26, the electric kettle and the heater as the identifying information of the loads corresponding to $C56$. Here, $Ci$ or $Cij$ is used as reference characters for distinguishing the features amounts, where $Ci$ is used for distinguishing sole loads and $Cij$ is used for distinguishing combinations of two loads. According to this naming rule the reference characters for distinguishing combinations of three loads will be $Cijk$. The reference characters for distinguishing combinations of four loads will be $Cijkl$. A similar naming rule may be applied to combinations of five or more loads. The feature amount $Cij$ is a synthetic vector of the feature amount $Ci$ and the feature amount $Cj$. In case where the load number obtaining unit 28 has obtained information as to how many the loads are, the load estimating unit 24 may be configured to narrow down comparison candidates to the feature amounts of the combinations of that number of loads. If the number of the loads is 2, $Cij$ is the comparison candidates. If the number of loads is 4, $Cijkl$ is the comparison candidates. Some loads such as driers and heaters would possibly have a switch for switching over power consumption. In this case, the feature amount of the load may be a feature amount of the maximum power consumption selectable by the switch. Moreover, some loads such as rice cookers have many operation modes. For example, in some cases, rice cookers have a mode for cooking normal rice and a triode for cooking brown rice. In some cases, manufacturers of such rice cookers publish the power consumptions of specific operations modes. In this case, the feature amount may be the feature amount of the specific operation mode. As such, the feature mount of loads would possibly vary depending on the usages and operation modes, and therefore, such feature amounts of standard usages and operation modes of the loads may be obtained in advance and stored in the storage device 22.

[Power Data]

The operable time calculating unit 25 is configured to calculate out a remaining operable time [h] basically from an instantaneous value [W] of the power consumption of the Whole loads at the moment and a power amount [Wh] available from the remaining amount of the fuel and the charge level, and to output the remaining operable time to the display device 13 or the communication circuit 12 from time to time. However, the operable time calculating unit 25 may calculate out the continuous operable bane by using the following method.

FIG. 6 illustrates one example of the power data 27. The power data 27 includes the rated power consumptions of the loads and typical power amount. The typical power amount is a minimum power amount necessary for accomplishing the main object (typical work) of an electric device. For example, a typical power amount for a rice cooker is a power amount necessary from the start to the end of the rice cooking. For example, if the load estimating unit 24 estimates that the plurality of loads connected with the power supply device 1 are an electric kettle and a rice cooker, the operable time calculating unit 25 refers to the power data 27, obtains the rated power consumption of the electric kettle and the rated power consumption of the rice cooker, and adds these rated power consumptions together. The operable time calculating unit 25 calculates out an available power an from the remaining amount of the fuel and the charge level. Furthermore, the operable time calculating unit 25 calculates out the continuous operable time by dividing the available power amount with the sum of the rated power consumption of the electric kettle and the rated power consumption of the rice cooker, and outputs the continuous operable time to the display device 13 or the communication circuit 12. As an alternative, the operable time calculating unit 25 calculates out an available power amount from the remaining amount of the fuel and the charge level, and if the scrum of the rated power consumption of the electric kettle and the rated power consumption of the rice cooker is equal to or smaller than the available (suppliable) power amount, the operable time calculating unit 25 outputs, to the display device 13 or the communication circuit 12, information indicating that both of the electric kettle and the rice cooker can accomplish the main objects, respectively. If the sum of the rated power consumption of the electric kettle and the rated power consumption of the rice cooker is larger than the available power amount, the operable time calculating unit 25 outputs, to the display device 13 or the communication circuit 12, information (such as warning message) indicating that both of the electric kettle and the rice cooker cannot accomplish the main objects, respectively. The warning message may be outputted from a speaker or a buzzer as a voice message or a warning sound.

[Flow Chart]

Figure 7:
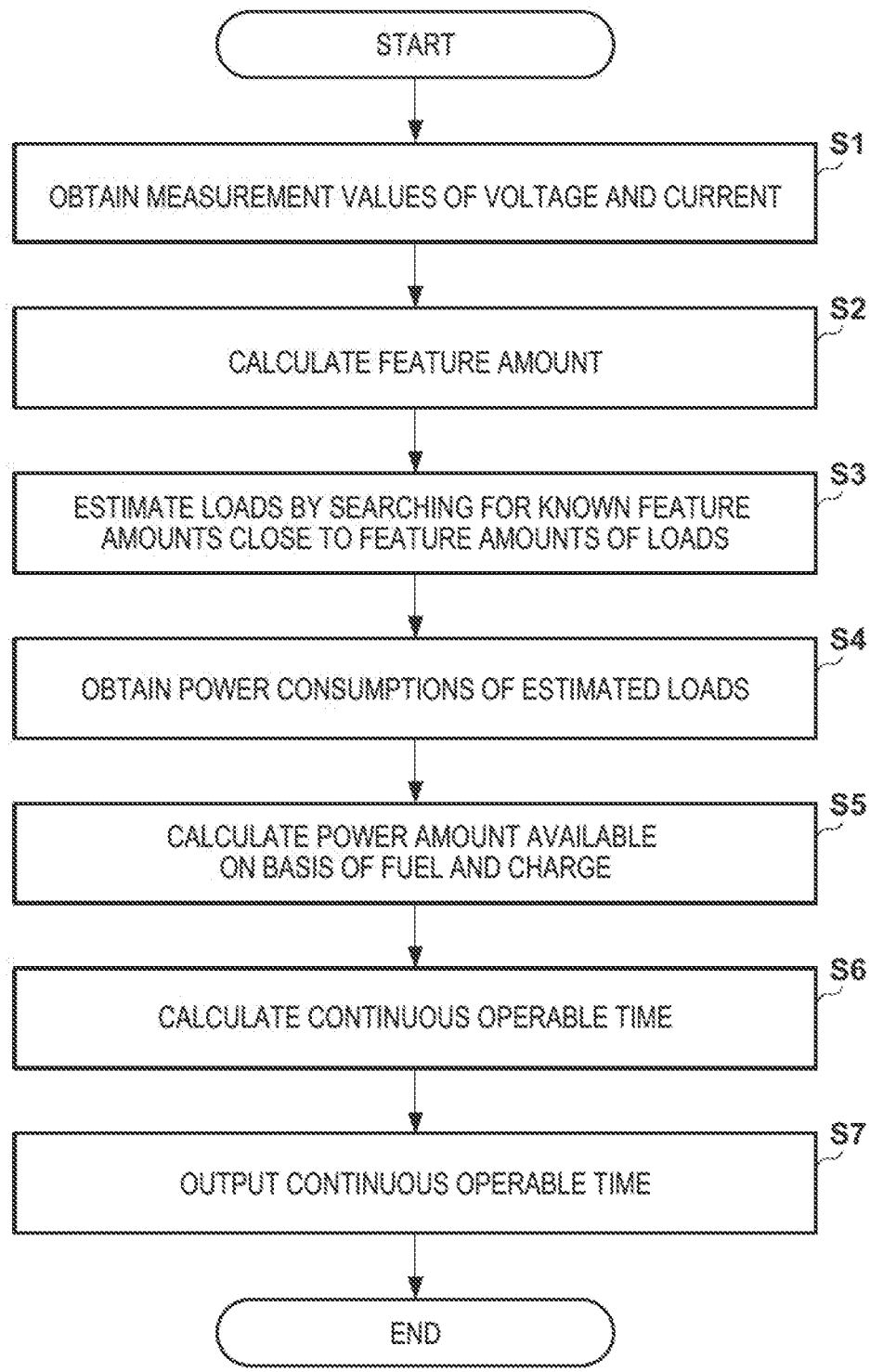
FIG. 7 is a flowchart illustrating a load estimating method.

FIG. 7 illustrates a load estimating method performed by the CPU 21 according to the control programs.

At Step S1, the CPU 21 (the feature amount calculating unit 23) obtains, by using the measuring circuit 6, the measurement values of the voltage and current supplied to the loads 17.

At Step S2, the CPU 21 (the feature amount calculating unit 23) obtains the feature amounts (for example, the power factors or the apparent powers) of the loads 17 by using the measurement values of the voltage and current.

At Step S3, the CPU 21 (the load estimating unit 24) estimates what the loads 17 are, by searching for known feature amounts close to the feature amounts of the loads 17. As described above, the storage device 22 stores therein the feature amount data 26 including known feature amounts. Therefore, the load estimating unit 24 determines the feature amounts close to the feature amounts of the loads 17 from among the feature amount data 26, and obtains the identifying information of the loads associated with the known feature amounts thus determined. The identifying information of the loads may be the names or types of the loads, Ci, Cij, or the like for example.

At Step S4, the CPU 21 (the load estimating unit 24 or the operable time calculating unit 25) obtains from the power data 27 the power consumptions of the loads thus estimated. As illustrated in FIG. 6, the power data 27 includes the rated power consumptions in association with the identifying information of the loads. Thus, the operable time calculating unit 25 obtains, from the power data 27, rated power consumptions corresponding to the identifying information of the loads. If the load estimating unit 24 estimates a combination of a plurality of loads (for example, if Cij or Cijk is estimated), the operable time calculating unit 25 obtains, from the power data 27, the rated power consumptions of the respective ones of the plurality of loads.

At Step S5, the CPU 21 (the operable time calculating unit 25) calculates out the power amount available from the power supply device 1. In the case of the power supply device 1 as illustrated in FIG. 1, the operable time calculating unit 25 calculates out the power amount available from the power supply device 1 on the basis of the remaining amount of fuel detected by the remaining amount sensor 16. In the case of the power supply device 1 as illustrated in FIG. 2, the operable time calculating unit 25 calculates out the power amount available from the power supply device 1 on the basis of the charge level of the storage battery 14 detected by the remaining amount sensor 16. In the case of the power supply device 1 as illustrated in FIG. 3, the operable time calculating unit 25 calculates out the power amount available from the power supply device 1 on the basis of the remaining amount of fuel detected by the remaining amount sensor 16 and the charge level of the storage battery 14 detected by the remaining amount sensor 16. A formula or a function for converting the measurement results of the remaining amount sensor 16 into a power amount may be stored in the storage device 22.

At Step S6, the CPU 21 (the operable time calculating unit 25) calculates out the continuous operable time of the loads thus estimated, by dividing the available power amount with the rated power consumptions of the loads. Instead of the rated power consumptions of the loads, the instantaneous value of the power consumption of the whole loads may be used. The continuous operable time is a time during which the loads thugs estimated can operate continuously (in a non-stopped manner).

At Step S7, the CPU 21 (the operable time calculating unit 25) outputs the continuous operable time to the display device 13 or the communication circuit 12. The operable time calculating unit 25 may be configured to output the continuous operable time together with the identifying information of the loads. Moreover, the operable time calculating unit 25 may be configured to determine whether or not the available power amount is equal to or more than typical power amount of the loads thus estimated, in order to determine whether or not the loads thus estimated can accomplish the main objects (typical operations of the loads). If the available power amount is smaller than the typical power amount of the loads thus estimated, the operable time calculating unit 25 may output warning that indicates that the loads thus estimated cannot accomplish the main objects (typical operations of the loads). For example, warning indicating that the rice cooker cannot accomplish the rice cooking may be outputted.

[Summary]

A first aspect provides a load estimating device 100. The measuring circuit 6 is one example of a measuring circuit for measuring a voltage and a current supplied to one load or a plurality of loads connected with a power generator. The feature amount calculating unit 23 is one example of calculating unit (e.g. one or more processors) configured to calculate feature amounts of the plurality of loads from measurement values of the voltage and current measured by the measuring circuit. The storage device 22 is one example of storage device configured to store feature amounts of combinations of two or more loads in advance. The load estimating unit 24 is one example of a load estimating unit (e.g. one or more processors) configured to estimate what the plurality of loads connected with the power generator are, on the basis of the feature amount or the feature amounts calculated by the calculating unit and the feature amounts stored in the storage device. According to the first aspect, it becomes possible to estimate the plurality of loads with good accurately by using a simpler method.

According to a second embodiment, the remaining amount sensor 16 is one example of a measuring circuit configured to measure a remaining amount of fuel contained in a fuel tank 15 for the power generator. The operable time calculating unit 25 is one example of a determining unit (e.g. one or more processors) configured to determine a time during which the plurality of loads estimated by the load estimating unit are continuously operable, on the basis of power consumptions of the plurality of loads, and the remaining amount of fuel. The communication circuit 12 or the display device 13 is ogre example of an output device for outputting the time during which the plurality of loads are continuously operable. With this, it becomes possible for the user to grasp the time during which the plurality of loads are continuously operable.

According to a third aspect, the power generator may include a storage battery 14 that is chargeable with the power generator and supplies power to the plurality of loads. The operable time calculating unit 25 may determine the time during which the plurality of loads are continuously operable, on the basis of power consumptions of the plurality of loads estimated by the load estimating unit, the remaining amount of fuel, and a charge level of the storage battery. As described above, the power may be supplied from both of the power generator and the storage battery temporally in parallel or temporarily in tandem. Even in this case, it becomes possible for the user to grasp the time in which the plurality of loads are continuously operable.

According to a fourth aspect, the feature amount or the feature amounts may include an apparent power and a power factor. The apparent power and the power factor can be obtained in a relatively short time, compared with feature amounts such as stable time. Thus, this configuration makes it possible to estimate the plurality of loads in a shorter time. However, the feature amount or the feature amounts may further include a stable time or a peak value of an activation current.

According to a fifth aspect, the storage device 22 may store therein a feature amounts Ci solely of loads, and feature amounts Cij, Cijk, . . . of combinations of two or more loads. If a feature amount of a load close to the feature amount calculated by the calculating unit is not stored in the storage device, the load estimating unit 24 may search for a feature amount of a combination of two or more loads close to the feature amount calculated by the calculating unit. In this manner, the load estimating unit 24 may estimate a plurality of loads. In such a case where there are no load candidates of sole loads, the searching may search for feature amounts of load candidates of combinations of two or more loads, gradually increasing the number of the loads in the combinations.

According to a sixth aspect, the load number obtaining unit 28 is one example of an obtaining unit (e.g. one or more processors) configured to obtain the number of loads connected with the power generator. The load estimating unit 24 may estimate the plurality of loads after narrowing down comparison candidates to be compared with the feature amounts calculated by the calculating unit to the feature amounts of combinations of the number of loads obtained by the obtaining unit among the features of the combinations of two or more loads stored in the storage device. If the comparison candidates are narrowed down as such, this would further facilitate the completion of the load estimation in a shorter time.

According to a seventh aspect, the load estimating device may include: a measuring circuit for measuring a voltage and a current supplied to a plurality of loads connected with a power supply device; a calculating unit (e.g. one or more processors) configured to calculate feature amounts of the plurality of loads from measurement values of the voltage and current measured by the measuring circuit; storage device for storing feature amounts of combinations of two or more loads in advance; and a load estimating unit (e.g. one or more processors) configured to estimate what the plurality of loads connected with the power supply device are, on the basis of the feature amounts calculated by the calculating unit and the feature amounts stored in the storage device. According to the seventh aspect, it becomes possible to estimate the plurality of loads with good accuracy by using a simpler method.

According to an eighth aspect, the load estimating device may include: a gauging unit configure (e.g. one or more processors) to gauge a power amount available from the power supply device; a determining unit (e.g. one or more processors) configured to determine a time during which the plurality of loads estimated by the load estimating unit are continuously operable, on the basis of power consumptions of the plurality of loads, and the power amount, and an output device configured to output the time during which the load is continuously operable. With this, it becomes possible for the user to grasp the time during which the plurality of loads are continuously operable.

According to a ninth aspect, the power supply device may be a power generator, a storage battery, or a power generator including a storage battery. As such, the ninth aspect provides a load estimating device far various power supply devices.

A tenth aspect provides a power supply device 1, including the load estimating device according to any one of the first to ninth aspects. Such a load estimating device may be provided in such a way that the load estimating device is integrated in the power supply device 1.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A load estimating device, comprising:
   a measuring circuit configured to measure a voltage and a current supplied to a plurality of loads connected with a power supply device;
   a calculating unit configured to calculate feature amounts of the plurality of loads from measurement values of the voltage and the current measured by the measuring circuit;
   a storage device configured to store a feature amount of each combination of two or more loads in advance; and
   a load estimating unit configured to estimate what the plurality of loads connected with the power supply device are, on the basis of the feature amounts calculated by the calculating unit and the feature amounts stored in the storage device,
   wherein the feature amount includes a combination of an apparent power and a power factor.

2. The load estimating device according to claim 1, comprising:
   a gauging unit configured to gauge a power amount available from the power supply device;

a determining unit configured to determine a time during which the plurality of loads estimated by the load estimating unit are continuously operable, on the basis of power consumptions of the plurality of loads, and the power amount; and an output device configured to output the time during which the plurality of loads are continuously operable.

3. The load estimating device according to claim 1, wherein
the power supply device is a power generator, a storage battery, or a power generator including a storage battery.

4. The load estimating device according to claim 2, wherein
the power supply device is a power generator,
the gauging unit is configured to gauge a remaining amount of fuel contained in a fuel tank for the power generator, and
the determining unit is configured to determine a time during which the plurality of loads estimated by the load estimating unit are continuously operable, on the basis of power consumptions of the plurality of loads, and the remaining amount of fuel.

5. The load estimating device according to claim 4, wherein
the power generator further includes a storage battery that is chargeable with the power generator and supplies power to the plurality of loads, and
the determining unit is configured to determine a time during which the plurality of loads estimated by the load estimating unit are continuously operable, on the basis of the power consumptions of the loads, the remaining amount of fuel, and the charge level of the storage battery.

6. The load estimating device according to claim 1, wherein
the storage device stores a feature amount of a load, and feature amounts of combinations of two or more loads, and
if a features amount of a load close to the feature amounts calculated by the calculating unit is not stored in the storage device, the load estimating unit estimates the plurality of loads by searching for the feature amount of a combination of two or more loads close to the feature amounts calculated by the calculating unit.

7. The load estimating device according to claim 1, comprising
an obtaining unit configured to obtain the number of loads connected with the power supply device,
wherein the load estimating unit estimates the plurality of loads after narrowing down comparison candidates to be compared with the feature amounts calculated by the calculating unit to the feature amounts of combinations of the number of loads obtained by the obtaining unit among the features of the combinations of two or more loads stored in the storage device.

8. A power generator system provided with a load estimating device, the load estimating device comprising:
a measuring circuit configured to measure a voltage and a current supplied to a plurality of loads connected with a power supply device;
a calculating unit configured to calculate feature amounts of the plurality of loads from measurement values of the voltage and the current measured by the measuring circuit;
a storage device configured to store a feature amount of each combination of two or more loads in advance; and
a load estimating unit configured to estimate what the plurality of loads connected with the power supply device are, on the basis of the feature amounts calculated by the calculating unit and the feature amounts stored in the storage device,
wherein the feature amount includes a combination of an apparent power and a power factor.

9. A load estimating device, comprising:
a measuring circuit configured to measure a voltage and a current supplied to a plurality of loads connected with a power supply device;
one or more processors configured to obtain feature amounts of the plurality of loads from measurement values of the voltage and the current measured by the measuring circuit; and
a storage device configured to store a feature amount of each combination of two or more loads in advance,
wherein the one or more processors is further configured to estimate what the plurality of loads connected with the power supply device are, on the basis of the obtained feature amounts and the feature amounts stored in the storage device, and
wherein the feature amount includes a combination of an apparent power and a power factor.

* * * * *